(12) United States Patent
Abhishek et al.

(10) Patent No.: US 10,191,110 B2
(45) Date of Patent: Jan. 29, 2019

(54) APPARATUS AND METHOD FOR SELF-TESTING AN INTEGRATED CIRCUIT

(71) Applicant: FREESCALE SEMICONDUCTOR, INC., Austin, TX (US)

(72) Inventors: Kumar Abhishek, Austin, TX (US); Regis Gubian, Pibrac (FR); Sakshi Gupta, Delhi (IN); Sunny Gupta, Noida (IN); Kushal Kamal, New Delhi (IN)

(73) Assignee: NXP USA, INC., Austin, TX (US)

( * ) Notice: Subject to any disclaimer, the term of this patent is extended or adjusted under 35 U.S.C. 154(b) by 449 days.

(21) Appl. No.: 15/006,570

(22) Filed: Jan. 26, 2016

(65) Prior Publication Data

US 2016/0231378 A1    Aug. 11, 2016

(51) Int. Cl.
*G01R 31/28* (2006.01)
*G05F 3/08* (2006.01)

(52) U.S. Cl.
CPC ........... *G01R 31/2884* (2013.01); *G05F 3/08* (2013.01)

(58) Field of Classification Search
CPC .............................. G05F 3/08; G01R 31/2884

USPC ...... 324/500, 750.15–750.3, 756.01, 762.03, 324/763.01, 600, 610, 656, 705, 76.11, 324/76.77; 341/120, 122; 714/734, 733, 714/724, 740

See application file for complete search history.

(56) References Cited

U.S. PATENT DOCUMENTS

| | | | |
|---|---|---|---|
| 6,557,131 B1 * | 4/2003 | Arabi | H03M 1/109 714/733 |
| 7,928,744 B2 | 4/2011 | Price et al. | |
| 8,099,252 B2 | 1/2012 | Warren et al. | |
| 9,134,395 B2 | 9/2015 | Ren et al. | |

* cited by examiner

*Primary Examiner* — Melissa Koval
*Assistant Examiner* — Trung Nguyen

(57) ABSTRACT

An integrated circuit and a method of self-testing the integrated circuit are provided. The method comprises: generating a reference voltage at an output of a reference circuit; initiating a test of the reference circuit during a test mode; determining whether the test of the reference circuit passes; and comparing, if the test of the reference circuit passes, a first voltage with the reference voltage. The disclosed test method provides for more complete testing of the integrated circuit.

18 Claims, 5 Drawing Sheets

APPARATUS AND METHOD FOR SELF-TESTING AN INTEGRATED CIRCUIT

BACKGROUND

Field

This disclosure relates generally to testing, and more specifically, to a self-test apparatus and method for testing an integrated circuit.

Related Art

Integrated circuits (IC) used in safety critical applications include various self test mechanisms used for checking components of the IC for correct functionality throughout the life of the IC. For example, some examples of safety critical applications in automobiles involve anti-lock braking control, airbag control, and engine controllers. In some ICs, a defect may be hidden and result in a defective IC passing the self test. For example, in a power management controller, comparators are used to determine if a supply voltage is within a predetermined acceptable range. If the supply voltage is not within the range, unreliable operation may result if the comparators fail to detect the correct range of operation. It is desirable that the power management controller be tested completely so that correct operation is insured.

Therefore, a need exists for more complete testing of a power management controller for an IC used in a safety critical application.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
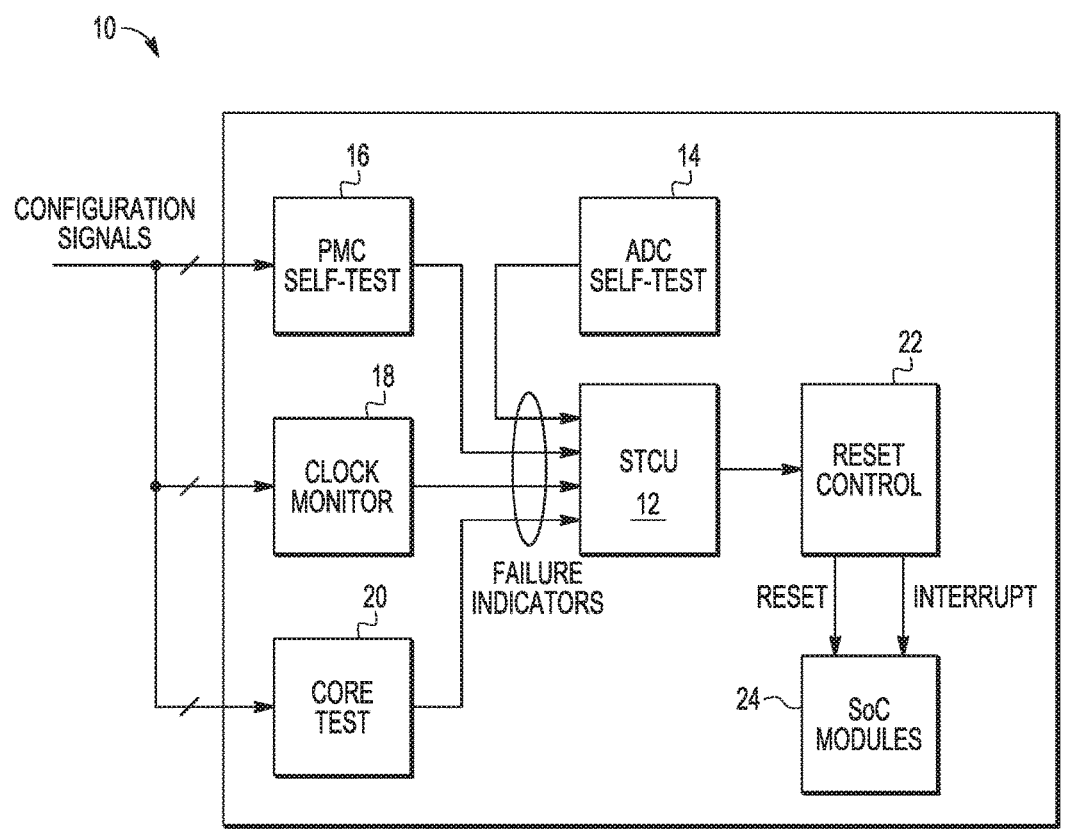
FIG. 1 illustrates, in block diagram form, an integrated circuit having self-test circuitry in accordance with an embodiment.

Generally, there is provided, a method for self-testing a power management controller. The method includes testing a reference voltage circuit for providing a reference voltage, and for testing a plurality of comparators for comparing the reference voltage to one or more power supply voltages. Because stability of the reference voltage may be important, the reference voltage may be a bandgap generated reference voltage. The method uses a digital-to-analog converter (DAC) to provide a linear voltage ramp for testing the output voltage of the reference circuit and the low and high voltage detection accuracy of the plurality of comparators. To save time, the output voltage of the DAC is provided to all of the comparators at the same time. The self-test is performed periodically during operation of the power management controller in a system-or-a-chip (SoC) used in safety critical applications. In one embodiment, the reference voltage is a common reference that is provided to each of the comparators. In another embodiment, each of the reference inputs of the plurality of comparators receives a separate reference voltage.

In one embodiment, there is provided, an a method of testing comprising: generating a reference voltage at an output of a reference circuit; initiating a test of the reference circuit during a test mode; determining whether the test of the reference circuit passes; and comparing, if the test of the reference circuit passes, a first voltage with the reference voltage. The reference circuit may be a bandgap reference circuit. The first voltage may be a voltage generated by a digital-to-analog converter. The step of comparing may comprise comparing with a voltage comparator. The test of the reference circuit may further comprise a stuck-at test and a voltage range test. The determining may be based upon the first voltage meeting a predetermined criterion. The method may further comprise adjusting a trim for the reference circuit to adjust the reference voltage, based upon the determination that the test of the reference circuit fails. The first voltage may be a voltage representative of a voltage source during a normal operating mode. The method may further comprise detecting, based upon the comparison of the first voltage with the reference voltage, that the first voltage falls below the reference voltage. The method may further comprise selectively coupling an analog-to-digital converter to the digital-to-analog converter in a loopback configuration such that the digital-to-analog converter can be tested.

In another embodiment, there is provided, An integrated circuit comprising: a controller for controlling circuitry during a test mode; a digital-to-analog converter coupled to the controller, the digital-to-analog converter outputting a voltage; a reference circuit for generating a reference voltage; a voltage comparator coupled to the controller, the voltage comparator configured in the test mode to compare the digital-to-analog converter output voltage with the reference voltage; wherein the controller initiates a test of the reference circuit to determine if the reference voltage is at a correct voltage level, and upon the reference circuit passing the test, the controller controls the digital-to-analog converter output voltage value such that the voltage comparator provides output to the controller whereby a pass or fail condition of the voltage comparator is determined. The integrated circuit may further comprise an analog-to-digital converter selectively being coupled to the digital-to-analog converter in a loopback configuration such that the digital-to-analog converter can be tested during the test mode. The voltage comparator may be configured in a normal operating mode to compare a first voltage source with the reference voltage. The test of the reference circuit may comprise a stuck-at test and a voltage range test. The voltage comparator may provide an output to the controller and if a fail condition is determined, the controller sends a failure indication. The reference circuit may be characterized as a bandgap reference circuit. The voltage comparator may be characterized as a low voltage detector (LVD) or a high voltage detector (HVD). The controller may send a failure indication upon failing the stuck-at test. Upon failing the voltage range test, the controller may send a trim adjust indication to the reference circuit.

In yet another embodiment, there is provided, a method of testing comprising: initiating a test sequence; generating a reference voltage at an output of a reference circuit; initiating a test of the reference circuit during the test sequence; determining whether the test of the reference circuit passes; comparing, if the test of the reference circuit passes, a first voltage with the reference voltage; and aborting the test sequence if the test of the reference circuit fails.

FIG. 1 illustrates, in block diagram form, an integrated circuit (IC) 10 having self-test circuitry in accordance with an embodiment. In one embodiment, IC 10 is a SoC that has one or more processor cores and one or more modules 24. The block labeled SoC modules 24 represents the cores and various functionality depending of the application. In one embodiment integrated circuit 10 includes self-test control unit (STCU) 12, analog-to-digital converter (ADC) test block 14, power management controller (PMC) self-test block 16, clock monitor block 18, core test block 20, reset control block 22, and other SoC circuit modules 24. Blocks ADC self-test 14, PMC self-test 16, clock monitor 18, and core test block 20 are coupled to provide failure indicators labeled "FAILURE INDICATORS" to STCU 12. STCU 12 will provide an output to reset control 22, and reset control 22 will provide one or more reset or interrupt signals, labeled "RESET" and "INTERRUPT" in FIG. 1, to various modules of IC 10 when a FAILURE INDICATOR indicates that a self-test failed. The various modules represented as SoC modules 24 will then take some action in response to the reset or interrupt signals. For example, a reset signal may be generated to restart IC 10 to see if that will correct the problem that causes the FAILURE INDICATOR to be sent.

In IC 10, configuration signals labeled "CONFIGURATION SIGNALS" can be provided to each of the self-test blocks for configuring various features and aspects of the self-test block. For example, a user may want to be able to enable or disable self-testing, to control how often a self-test is performed, and to selectively test the comparators.

In one embodiment, IC 10 is used in a safety critical application where failure of the IC may create a hazard. Because the IC is used in a safety critical application, it is desirable to provide a self-testing mechanism that can be run periodically to insure that the IC is operating correctly, and if a circuit fails, take an action. In IC 10, various systems can be tested during operation of the IC. A self-test method for testing PMC 16 will be discussed in more detail below. The other self-testing blocks of FIG. 1 will not be further discussed.

Figure 2:
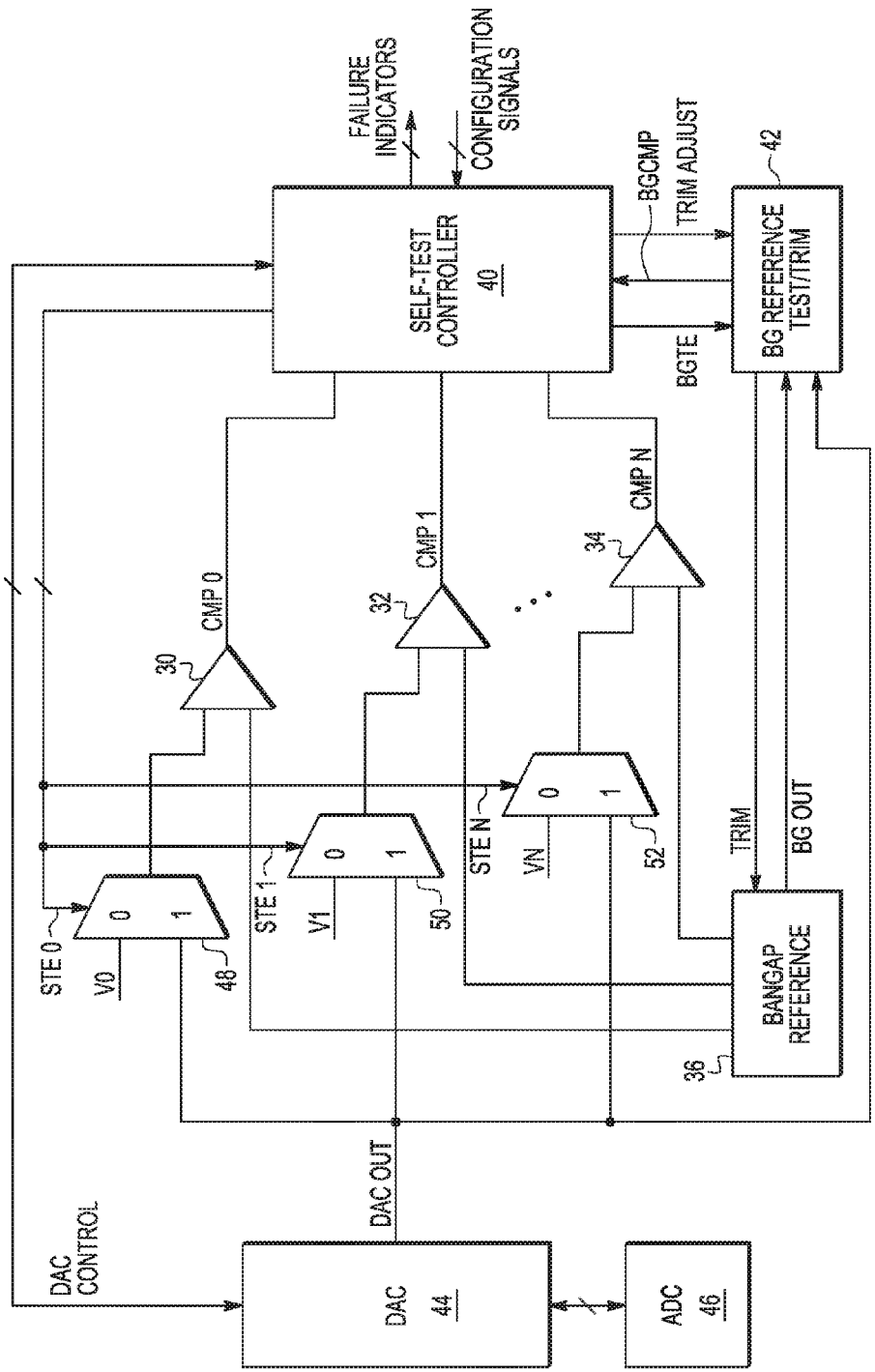
FIG. 2 illustrates, in block diagram form, the power management controller self-test block of the integrated circuit of FIG. 1 in accordance with an embodiment.

FIG. 2 illustrates, in block diagram form, PMC block 16 of the SoC of FIG. 1 in accordance with an embodiment. PMC block 16 includes comparators 30, 32, and 34, bandgap reference 36, self-test controller 40, bandgap reference test/trim block 42, DAC 44, ADC 46, and multiplexers 48, 50, and 52. Self-test controller 40, bandgap reference test/trim block 42, DAC 44, ADC 46, and multiplexers 48, 50, and 52 are used to test the operation of comparators 30, 32, and 34 and bandgap reference circuit 36. Comparators 30, 32, and 34 represent a plurality of comparators used for self-testing a low supply voltage condition and a high supply voltage condition in IC 10 for each supply voltage used by IC 10, for example, voltages labeled V0, V1, and VN. The number of comparators depends are what tests are required and on the complexity of IC 10. During a normal circuit operation, the comparators monitor the power supply voltages V0, V1, and VN for the low voltage and/or the high voltage condition by comparing the supply voltages to a known reference voltage. Depending on the magnitude of the supply voltage being compared for normal operation or for self testing, the supply voltage may first be divided, or converted, to a lower voltage so that the comparison can be made directly with the bandgap reference voltage. A bandgap based reference voltage is provided to an input of each of the comparators. Circuitry for converting the supply voltages to lower voltages is not illustrated in FIG. 2. Generating a bandgap reference voltage is well known. In the illustrated embodiment, a bandgap reference voltage is equal to about 1.25 volts, is based on the bandgap of silicon, and is relatively temperature independent.

In FIG. 2, each of comparators 30, 32, and 34 has a first input coupled to an output of a corresponding one of multiplexers 48, 50, and 52, a second input coupled to receive a bandgap based reference voltage, and an output for providing a corresponding one of the comparison results labeled "CMP 0", "CMP 1", and "CMP N", where "N" is an integer. Each of multiplexers 48, 50, and 52 has a first input coupled to receive a voltage from one of the voltage sources labeled "V0", "V1", and "VN", a second input coupled to an output of DAC 44, a control input coupled to self-test controller 40 for receiving a corresponding one of self-test enable signals labeled "STE 0", "STE 1", and "STE N", and an output coupled to the first input of a corresponding one of comparators 30, 32, and 34. Therefore, each of the multiplexers provides one of the voltage sources or the output of the DAC to an input of a comparator to be compared with the reference voltage. Bandgap reference test/trim block 42 has an output coupled to bandgap reference circuit 36 labeled "TRIM", an input coupled to an output of bandgap reference 36 labeled "BG OUT", an output coupled to an input of self-test controller 40 for providing a bandgap reference test result labeled "BGCMP", an input coupled to an output of self-test controller 40 for receiving a bandgap reference trim adjust signal labeled "TRIM ADJUST", an input coupled to an output of self-test controller 40 for receiving a bandgap test enable signal labeled "BGTE", and an input coupled to the output of DAC 44 for receiving an output signal labeled "DAC OUT". DAC 44 in bi-directionally coupled to self-test controller 40 for transmitting and receiving control signals labeled "DAC CONTROL". The self-testing operations of PMC block 16 will be discussed in the descriptions of FIG. 4 and FIG. 5.

ADC 46 is used in a loopback, or feedback, configuration to test the operation of DAC 44. DAC 44 is tested using ADC 46 prior to DAC 44 being used for testing PMC block 16. Also, ADC 46 must be tested because a fault with ADC 46 may prevent the self-test of the power management controller because operation of DAC 44 cannot be confirmed. However, specific testing of ADC 46 is not a part of this disclosure and will not be discussed. Note that DAC 44 may include any kind of DAC. For example, in one embodiment, DAC 44 includes a plurality of series-connected resistors coupled to receive a power supply voltage. Taps are provided at the connections between resistors and the taps include switches which can be selected using a binary code. The switches are for selecting an output voltage DAC OUT to be provided to a comparator during the self-testing operation.

Note that the comparators 30, 32, and 34 may not compare the actual supply voltages to the reference voltages. The voltages provided to the comparators may be scaled down or adjusted to the level of the bandgap reference. Conversely, in another embodiment, the bandgap reference may be scaled up to compare directly with the supply voltages.

Figure 3:
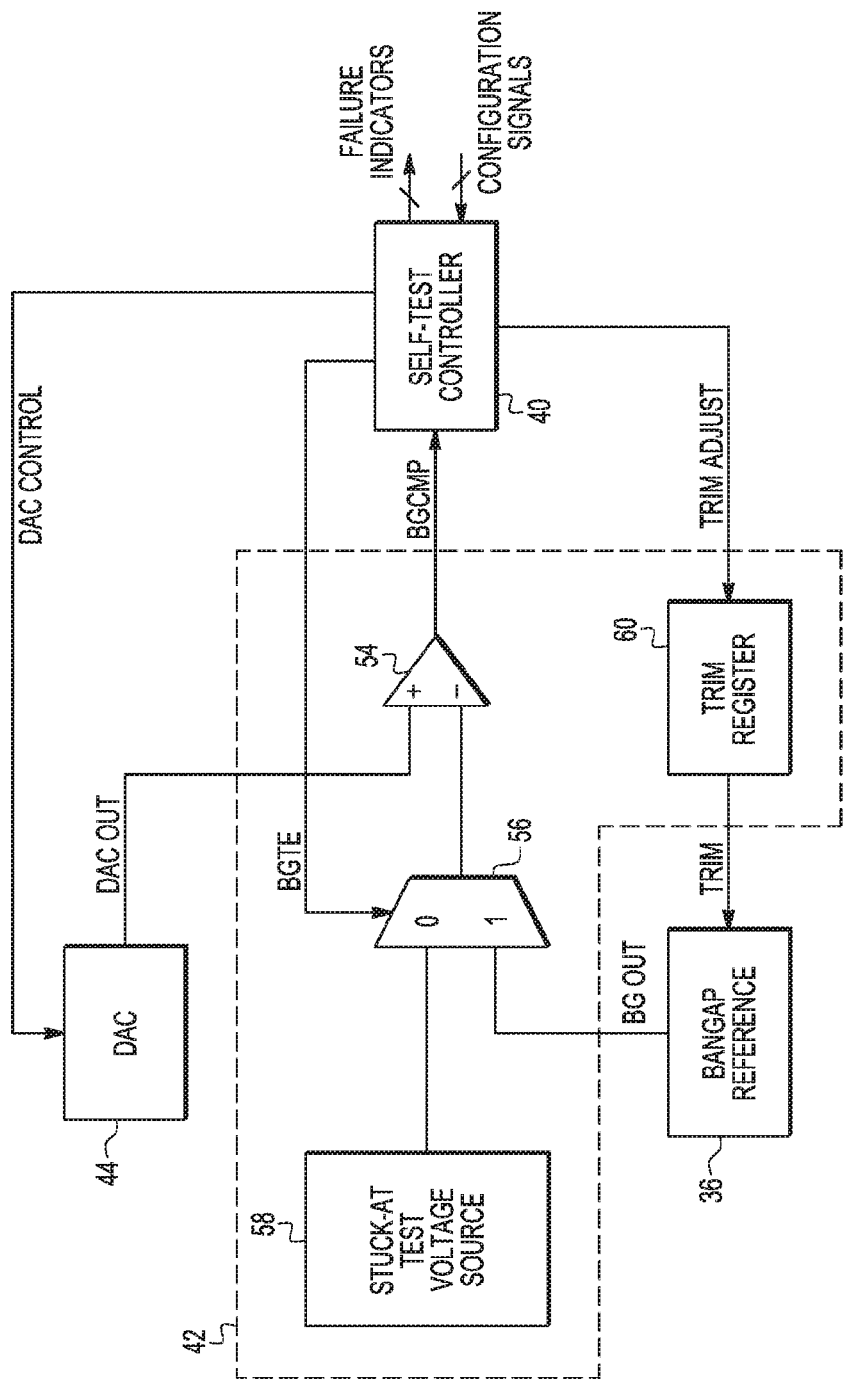
FIG. 3 illustrates, in block diagram form, a portion of the power management controller used to test the bandgap reference voltage circuit of FIG. 2.

FIG. 3 illustrates, in block diagram form, a portion of PMC self-test block 16 used to test the bandgap reference voltage circuit 36 of FIG. 2. Bandgap reference test/trim block 42 includes comparator 54, multiplexer 56, stuck-at test voltage source 58, and trim register 60. In bandgap reference test/trim block 42, comparator 54 has a first input coupled to DAC output DAC OUT, a second input coupled to the output of multiplexer 56, and bandgap comparison output BG CMP coupled to an input of self-test controller 40. Multiplexer 56 also has a first input coupled to an output of stuck-at test voltage source 58, and a second input coupled to the BG OUT output of bandgap reference 36. Trim register 60 has an input coupled to an output of self-test controller 40 for receiving a trim adjust signal labeled "TRIM ADJUST", and an output coupled to an input of bandgap reference circuit 36 for providing a trim signal labeled "TRIM". The operation of bandgap test/trim block 42 will be discussed in the description of FIG. 4.

Figure 4:
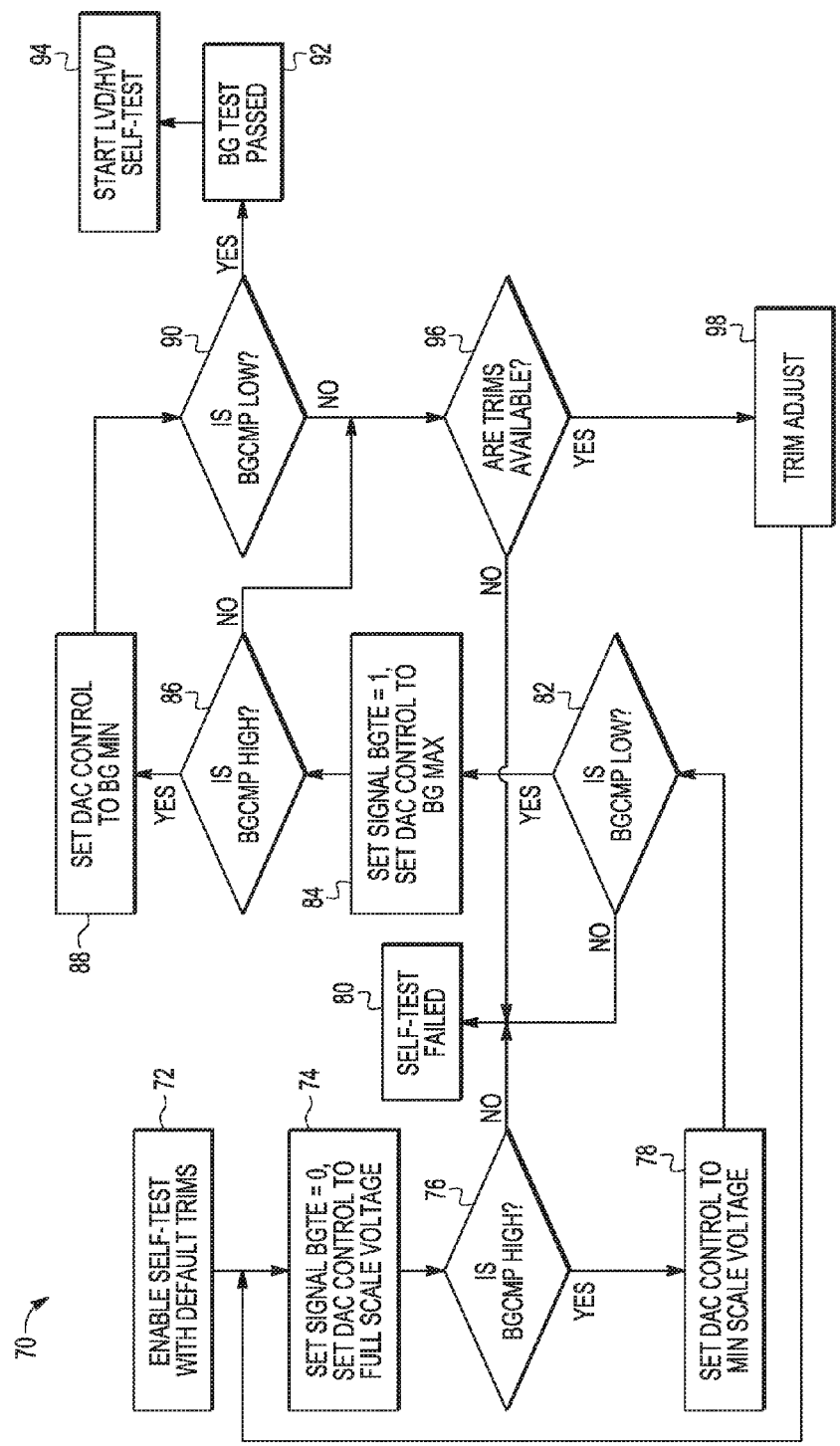
FIG. 4 illustrates a flowchart of a method for self-testing and correcting the bandgap reference voltage circuit of FIG. 2.

FIG. 4 illustrates a flowchart of a method 70 for self-testing and correcting the bandgap reference voltage circuit of FIG. 2. Method 70 begins at step 72 and will be discussed in the context of FIG. 3. However, a similar test method can be performed using circuits different than those illustrated in FIG. 3. Method steps 74, 76, 78, and 82 are for determining if the comparator 54 (FIG. 3) is capable of switching the output voltage between logic high and low voltages. This is referred to as a stuck-at test. If the stuck-at test passes, the method 70 proceeds to test bandgap reference circuit 36. At step 72, the self-test method 70 is enabled. In the illustrated embodiment, enabling the self-test means entering a test mode. Most normal processing on integrated circuit 10 is halted while the integrated circuit 10 is in test mode and the self-test is being performed. If a part of the self-test fails, other processing will be performed that may include entering a reset mode or generating an interrupt as illustrated in FIG. 1 and discussed above. The method begins using default trims for trimming the magnitude of the bandgap reference voltage BG OUT. At step 74, the self-test method is enabled by asserting control signal BGTE as a logic low, or logic zero. As can be seen in FIG. 3, a stuck-at test voltage source is coupled to the input of multiplexer 56 labeled with a "zero" when test enable signal BGTE is a logic low. The stuck-at test voltage source provides a test voltage that is appropriate for testing if comparator 54 will trip between providing high and low output voltages in response to predetermined input voltages. In one embodiment, the stuck-at voltage source 58 provides a voltage that is halfway between a logic high voltage and a logic low voltage. In other embodiments, the stuck-at voltage may be different. Also at step 74, DAC control signal DAC CONTROL is set so that DAC 44 provides a full scale, or full rail, voltage. At decision step 76, it is determined if output voltage BG CMP from comparator 54 corresponds to a logic high. If the output voltage BG CMP is not a logic high, the comparator is not functioning properly and the NO path is taken from step 76 to step 80, and the self-test has failed. The method of testing is aborted when the self-test fails at step 80. A failure indication FAILURE INDICATION is provided to STCU 12. However, if the output voltage BG CMP is a logic high as expected for a functioning comparator, the YES path is taken from step 76 to step 78. At step 78, the DAC CONTROL signal is set so that DAC 44 will provide a minimum scale voltage to the positive input of comparator 54. At decision step 82, it is determined if comparator output signal BG CMP is a logic low voltage. If output signal BG CMP is not a logic low voltage, the NO path is taken to step 80, and an indication that the self-test failed is provided to STCU 12. The self-test is aborted at step 80. If output signal BG CMP is a logic low voltage, then comparator 54 passed the stuck-at test and the YES path is taken from decision step 82 to step 84. Note that the method of the illustrated embodiment tests for a logic high comparator output voltage and then tests for a logic low comparator output voltage. In another embodiment, the comparator may be tested for a logic low output voltage before being tested for a logic high output voltage.

Figure 5:
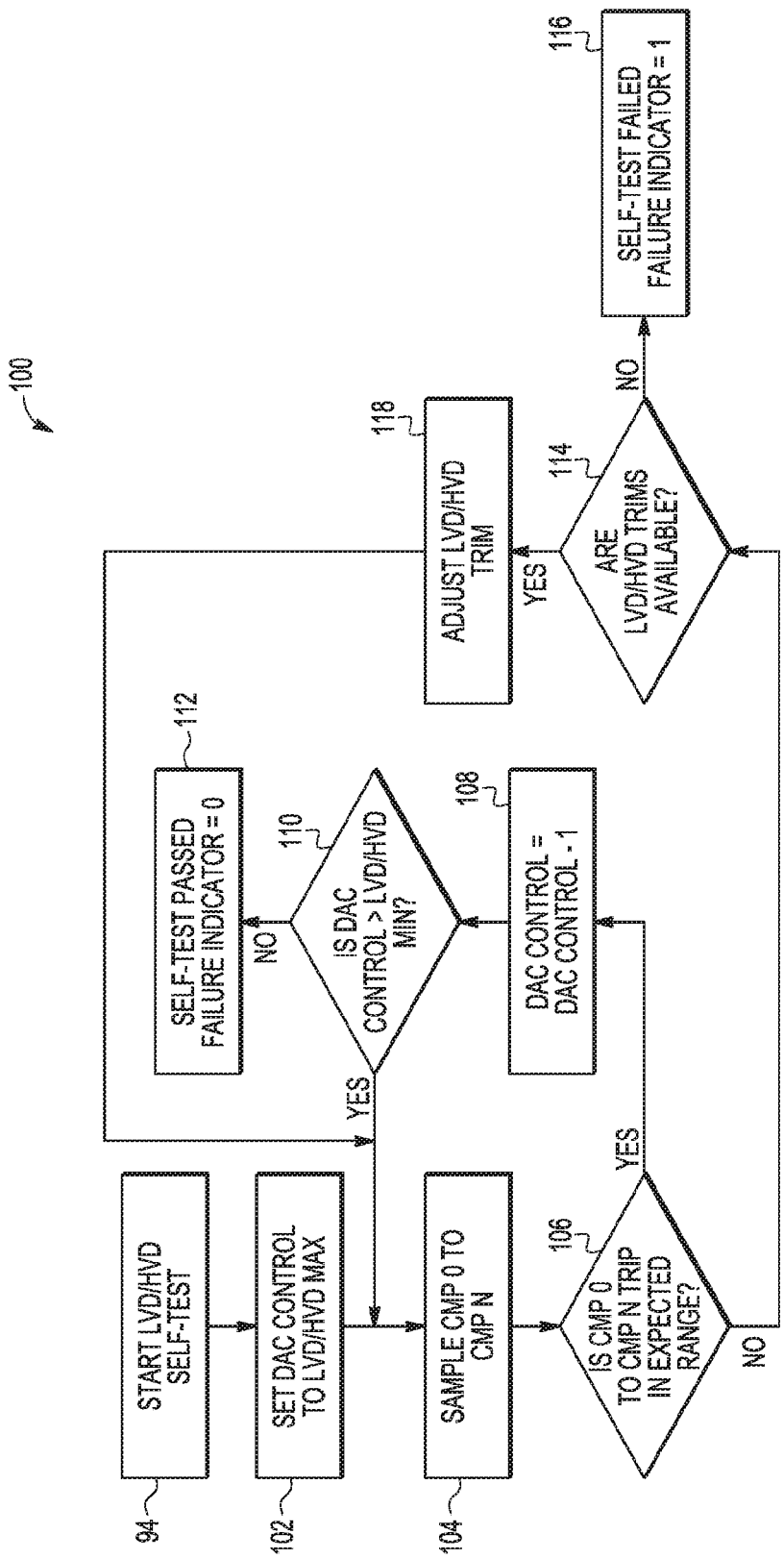
FIG. 5 illustrates a flowchart of a method for self-testing a low voltage detection function and a high voltage detection function of the power management controller of FIG. 1.

Beginning at step 84, the bandgap voltage is tested. At step 84, bandgap test enable signal BGTE is asserted as a logic high, or logic one, so that the output BG OUT of bandgap reference block 36 is provided to the positive input, or the input labeled with a number "1", of multiplexer 56. Also at step 84, DAC control signal DAC CONTROL is set so that DAC 44 will provide an output voltage having a maximum value (BG MAX) to the positive input of comparator 54 to compare with bandgap voltage BG OUT. Testing of the comparator comprises comparing the BG OUT voltage to the DAC OUT voltage and determining whether the comparator output BG CMP indicates a favorable comparison based on a predetermined criterion. At decision step 86, it is determined if comparator output voltage BG CMP is a logic high voltage. If output voltage BG CMP is not a logic high voltage, then the comparison failed, and the NO path is taken to decision step 96. If the output voltage BG CMP is a logic high voltage, the comparator tripped correctly, and the YES path is taken to step 88. At step 88, DAC control signals DAC CONTROL are used to set DAC output voltage DAC OUT to a minimum voltage (BG MIN) to compare with the bandgap reference voltage BG OUT. The voltages provided by DAC 44 are representative of the voltage provided by a voltage source during normal operation of the integrated circuit. At decision step 90, it is determined if comparator output voltage BG CMP a logic low voltage. If the comparator output voltage BG CMP is a logic low, then the YES path is taken to step 92. The bandgap comparator test passed. At step 94, the low voltage detection (LVD) and high voltage detection (HVD) self test can be started. The LVD/HVD self-test is illustrated in FIG. 5 and is discussed below. If at decision step 90 the comparator output BG CMP is not a logic low, then the NO path is taken to decision step 96. At decision step 96, it is determined if there are trim taps available to provide further adjustment to the bandgap reference voltage BG OUT. Adjusting the bandgap reference voltage output BG OUT may correct the operation of comparator 54. If there are not any trims available, then the NO path is taken to step 80 and the self-test has failed. When the self-test fails a FAILURE INDICATOR is provided to STCU 12 by self-test controller 40. A predetermined action will be initiated by the STCU 12 when the self-test fails. For example, a reset signal RESET may be provided or an INTERRUPT may be generated. If there are trims available, the YES path is taken to step 98, and the trims are used to adjust the magnitude of output voltage BG CMP. After adjusting the trims, the method returns to step 74. The steps are repeated until the trims are exhausted, or until the bandgap test is passed. If the test passes after adjusting the trims, at decision step 90, the YES path is taken to step 92 and a failure indicator, indicating that the bandgap test passed, may be provided to STCU 12. Note that the method is described as being a self-test in the illustrated embodiment. In other embodiments, the test may be controlled by an external tester or analyzer.

FIG. 5 illustrates a flowchart of method 100 for self-testing a low voltage detection (LVD) function and a high voltage detection (HVD) function of the power management controller 16 of FIG. 1. Many integrated circuits use more than one supply voltage. In a safety critical application, it is desirable to test that each of the supply voltages is at the correct level so that correct circuit operation of the integrated circuit is assured. Monitor circuits having comparators, such as comparators 30, 32, and 34, are used to determine that the supply voltages are within correct ranges. A comparator may be set up to detect if the supply voltage drops too low (low voltage detect LVD) by comparing the supply voltage to a predetermined reference voltage. The output of the comparator will change when the supply voltage input to the comparator drops below the predetermined reference voltage. Another comparator may be set up to detect if the supply voltage rises too high (high voltage detect HVD). In one embodiment, there is an allowed range of LVD voltages for each supply voltage and an allowed range of HVD voltages for each supply voltage. Self-test controller 40 is programmed with the LVD and HVD voltages for use in self-testing method 100. Comparators 30, 32, and 34 are tested to determine if the output voltage of each of the comparators meets one or more predetermined criteria in response to known input voltages. In one embodiment, the comparator is tested to determine if the comparator output trips as expected when the input voltages are within a predetermined voltage range.

Step 94 is carried over in FIG. 5 from the end of the method 70 in FIG. 4, and indicates the start of the LVD/HVD self-test. At step 102, the DAC CONTROL signal is used to adjust DAC 44 to provide the maximum voltage of the voltage range used for the LVD and/or HVD self-tests. Also, one or more of control signals STE 0-STE N are set to a logic one. DAC output voltage DAC OUT is then compared with a voltage from bandgap reference circuit 36. At step 104, the output voltages (CMP 0 to CMP N) of each of comparators 30, 32, and 34 are sampled. At decision step 106, it is determined if the sampled output voltages CMP 0 to CMP N were tripped in the expected test range. If the output voltage CMP 0 to CMP N were tripped in the expected test range, the YES path is taken to step 106. At step 106, DAC CONTROL code is decremented by one so that DAC 44 provides a DAC OUT voltage one step less than the previously provided voltage. In another embodiment, the DAC CONTROL code can be decremented by a different amount. At step 110, it is determined if DAC CONTROL is greater than the voltage set as the lower end of the range for the LVD/HVD self-test. If the voltage is greater than the minimum voltage for the range being tested, then the YES path is taken back to step 104 and steps 104, 106, and 108 are repeated. If the voltage is lower than the minimum voltage for the range, the range of test voltages has been completed, and the NO path is taken to step 112. At step 112, a FAILURE INDICATOR for indicating that the self-test passed is provided to STCU 12. After step 112, test mode is exited and a normal operating mode is resumed. The test mode may be entered periodically while integrated circuit 10 is operating. Referring back to decision step 106, if the tested comparator output voltage CMP 0-CMP N is not tripped within the expected range, then the NO path is taken to decision step 114. At decision step 114, it is determined if there are any LCD/HVD trims available for trimming the voltage range of the comparators. If there are trims available, the YES path is taken to step 118. At step 118, the LVD/HVD trims are adjusted and the flow returns to step 104. If there are no more trims available, then the NO path is taken from step 114 to step 116. At step 116, it is determined that the self-test has failed a failure indicator signal FAILURE INDICATOR is provided by STCU 40 (FIG. 4). STCU 40 may then cause a reset or an interrupt to be generated in response to the failed self-test.

The test method and circuits as described herein provides a self-testing method of a power management controller for an integrated circuit used in, for example, a safety critical application that tests a reference voltage source used for testing comparators that monitor supply voltage sources for a low voltage condition and a high voltage condition. Testing the reference voltage source first insures that the comparators trip at the correct voltages for indicating pass or fail of the LVD and HVD testing.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of testing comprising:
   generating a reference voltage at an output of a reference circuit;
   initiating a test of the reference circuit during a test mode;
   determining whether the test of the reference circuit passes by performing a stuck-at test with a test voltage source by applying a test voltage from the test voltage source to a voltage comparator and determining that the voltage comparator trips between low and high output voltages in response to predetermined input voltages; and
   after performing the stuck-at test with the test voltage source, comparing at the voltage comparator, if the test of the reference circuit passes, a first voltage with the reference voltage of the reference circuit to determine that the first voltage meets a predetermined criterion.

2. The method of claim 1, wherein the reference circuit is a bandgap reference circuit.

3. The method of claim 1, wherein the first voltage is a voltage generated by a digital-to-analog converter.

4. The method of claim 1, after performing the stuck-at test with the test voltage source, further comprising a voltage range test of the first voltage.

5. The method of claim 1, further comprising adjusting, based upon the determination that the test of the reference circuit fails, trim for the reference circuit to adjust the reference voltage.

6. The method of claim 1, wherein the first voltage is a voltage representative of a power supply voltage during a normal operating mode.

7. The method of claim 1, further comprising generating one of an interrupt or a reset signal if the test of the reference circuit fails and re-performing the stuck-at test.

8. The method of claim 3, further comprising selectively coupling an analog-to-digital converter to the digital-to-analog converter in a loopback configuration such that the digital-to-analog converter can be tested.

9. An integrated circuit comprising:
a controller for controlling circuitry during a test mode;
a digital-to-analog converter coupled to the controller, the digital-to-analog converter outputting a voltage;
a reference circuit for generating a reference voltage;
a voltage comparator coupled to the controller, the voltage comparator configured in the test mode to compare the digital-to-analog converter output voltage with the reference voltage;
wherein the controller initiates a test of the reference circuit to determine if the reference voltage is at a correct voltage level by applying, in the test mode, a test voltage from a test voltage source to the voltage comparator and determining that the voltage comparator trips between low and high output voltages in response to predetermined input voltages, and upon the reference circuit passing the test, the controller controls the digital-to-analog converter output voltage value such that the voltage comparator provides output to the controller whereby a pass or fail condition of the voltage comparator is determined.

10. The integrated circuit of claim 9, further comprising an analog-to-digital converter selectively coupled to the digital-to-analog converter in a loopback configuration such that the digital-to-analog converter is tested during the test mode.

11. The integrated circuit of claim 9, wherein the voltage comparator is configured in a normal operating mode to compare a first voltage source with the reference voltage.

12. The integrated circuit of claim 9, wherein the test of the reference circuit comprises a stuck-at test and a voltage range test.

13. The integrated circuit of claim 9, wherein the voltage comparator provides an output to the controller and if a fail condition is determined, the controller sends a failure indication.

14. The integrated circuit of claim 9, wherein the reference circuit is characterized as a bandgap reference circuit.

15. The integrated circuit of claim 11, wherein the voltage comparator is characterized as a low voltage detector (LVD) or a high voltage detector (HVD).

16. The integrated circuit of claim 12, wherein upon failing the stuck-at test, the controller sends a failure indication.

17. The integrated circuit of claim 16, wherein upon failing the voltage range test, the controller sends a trim adjust indication to the reference circuit.

18. A method of testing comprising:
initiating a test sequence;
generating a reference voltage at an output of a reference circuit;
initiating a test of the reference circuit during the test sequence;
determining whether the test of the reference circuit passes by performing a stuck-at test with a test voltage source by applying a test voltage from the test voltage source to a voltage comparator and determining that the voltage comparator trips between low and high output voltages in response to predetermined input voltages;
after performing the stuck-at test with the test voltage source, comparing at the voltage comparator, if the test of the reference circuit passes, a first voltage with the reference voltage of the reference circuit to determine that the first voltage meets a predetermined criterion; and
if the test of the reference circuit fails, aborting the test sequence and sending a failure indication.

* * * * *